United States Patent [19]

Falkenstein et al.

[11] Patent Number: 4,707,066

[45] Date of Patent: Nov. 17, 1987

[54] GLASS FIBER BUSHING THROUGH A WALL OPENING OF A HOUSING AND METHOD OF MANUFACTURE

[75] Inventors: Rudolf Falkenstein, Alzenau; Detlef Haberland, Steinebach; Michael Kaindl, Pfaffenhofen; Helmut Haltenorth, Munich; Herbert Prussas, Reicherthausen; Franz Taumberger, Munich, all of Fed. Rep. of Germany

[73] Assignee: Siemens Aktiengesellschaft, Berlin and Munich, Fed. Rep. of Germany

[21] Appl. No.: 659,892

[22] Filed: Oct. 11, 1984

[30] Foreign Application Priority Data

Oct. 12, 1983 [DE] Fed. Rep. of Germany ....... 3337131

[51] Int. Cl.4 ................................................ G02B 6/36
[52] U.S. Cl. .................................. 350/96.20; 350/96.21
[58] Field of Search ............... 350/96.15, 96.16, 96.17, 350/96.20

[56] References Cited

U.S. PATENT DOCUMENTS

| 3,792,284 | 2/1974 | Kaelin | 250/551 |
|---|---|---|---|
| 3,954,338 | 5/1976 | Hennel et al. | 356/138 |
| 4,065,203 | 12/1977 | Goell et al. | 350/96.20 |
| 4,119,363 | 10/1978 | Camlibel et al. | 350/96.20 |
| 4,166,668 | 9/1979 | MacLeod | 350/96.20 |
| 4,357,072 | 11/1982 | Goodfellow et al. | 350/96.20 |
| 4,368,481 | 1/1983 | Ohashi et al. | 357/30 |
| 4,385,797 | 5/1983 | Dubois et al. | 350/96.20 |
| 4,548,466 | 10/1985 | Evans et al. | 350/96.20 |

FOREIGN PATENT DOCUMENTS

| 1108900 | 9/1981 | Canada . |
|---|---|---|
| 0104882 | 4/1984 | European Pat. Off. . |
| 0111264 | 6/1984 | European Pat. Off. . |
| 0111263 | 6/1984 | European Pat. Off. . |
| 2207900 | 10/1972 | Fed. Rep. of Germany . |
| 2618095 | 11/1977 | Fed. Rep. of Germany . |
| 2741585 | 3/1979 | Fed. Rep. of Germany . |
| 2940316 | 4/1980 | Fed. Rep. of Germany . |
| 3008255 | 9/1980 | Fed. Rep. of Germany . |
| 3032172 | 3/1981 | Fed. Rep. of Germany . |
| 3010820 | 9/1981 | Fed. Rep. of Germany . |
| 8211582 | 10/1982 | Fed. Rep. of Germany . |
| 3244867 | 6/1984 | Fed. Rep. of Germany . |
| 3244882 | 6/1984 | Fed. Rep. of Germany . |
| 54-74454 | 6/1979 | Japan . |
| 55-22709 | 2/1980 | Japan . |
| 57-100781 | 6/1982 | Japan . |
| 2026194 | 1/1980 | United Kingdom . |
| 2034068 | 5/1980 | United Kingdom . |
| 2052785 | 1/1981 | United Kingdom . |
| 2065918 | 1/1981 | United Kingdom . |
| 2053563 | 2/1981 | United Kingdom . |

OTHER PUBLICATIONS

Althaus et al., "Lasersender in Modulbauweise", Telecom report, vol. 6, 1983, pp. 90–95.
Hydra Handbook, No. 441, 1979, pp. 8–9, 26–27.

*Primary Examiner*—William L. Sikes
*Assistant Examiner*—Akm E. Ullah
*Attorney, Agent, or Firm*—Hill, Van Santen, Steadman & Simpson

[57] ABSTRACT

A glass fiber bushing is provided for a wall opening of a housing which has a light-transmitting or a light receiving component mounted therein, the component having an optically-active location to be optimally coupled to the tip of the glass fiber. At least in the region of the opening through the housing, the glass fiber is firmly surrounded by and is secured in a stiff tube which is inserted through the wall opening. An adjustment member which adjusts the glass fiber position is slipped with a tight clearance over the tube and/or over a transition piece which is secured to the tube. An end face of the adjustment member is oriented toward the exterior surface of the housing in the region surrounding the wall opening. At least close to the tip of the glass fiber, the outer diameter of the glass fiber or of a glass fiber protective layer is surrounded by the inner wall of the tube with so little play that the tube defines the position of the tip of the glass fiber. In a region between the adjustment member and the component the tube is plugged through an elastic membrane of the wall opening. A surface of the membrane is secured to the housing in the area of the wall opening. The end face of the adjustment member which adjusts the position of the tube and, therewith, the position of the glass fiber is secured to the exterior surface of the housing.

27 Claims, 2 Drawing Figures

GLASS FIBER BUSHING THROUGH A WALL OPENING OF A HOUSING AND METHOD OF MANUFACTURE

BACKGROUND OF THE INVENTION

1. Field of the Invention

The present invention relates to an improvement of a glass fiber bushing of the type which extends through a wall opening of a housing, preferably a gas-tight or air-tight metal housing, as described in the German DOS No. 32 44 867.

2. Description of the Prior Art

The present invention was particularly developed for receiver modules having photodiodes and components thereof, as well as for transmitting modules having solid-state lasers as components thereof which are employed in digital switching systems with glass fibers which conduct light pulses modulated with information. Over and above this, however, the invention is useable in all other glass fiber bushings of the general type set forth above. The outer diameter of the glass fiber, or of a glass fiber protective layer, is surrounded, at least close to the tip of the glass fiber, by the inner wall of the tube with so little play, for example by way of fixing with an adhesive or a solder metal, that the tube defines the position of the glass fiber, particularly the tip thereof. The tube is plugged through an elastic membrane of the wall opening in a region between the adjustment member and the component. A surface of the membrane is secured to the housing in the environment of the wall opening. Also, the end face of the adjustment member for adjusting the position of the tube and, therewith, the position of the glass fiber is secured to the exterior surface of the housing.

Given the earlier glass fiber bushing, the housing already has a protective function for the light-transmitting and/or light-receiving component attached thereto. The housing, in particular, is both light-tight and gas-tight or, respectively, air-tight. The component therein is not only protected against injurious gases, but condensation water can no longer collect therein over time, whereby condensation water would deteriorate the quality of the light coupling between the component and the tip of the glass fiber. The earlier housing also offers considerable protection for its internal parts, for example glass fiber and component, against mechanical destruction due to blows or, respectively, acceleration. A pulling on the glass fiber, generally quite unintentional, from the exterior of the earlier housing hardly changes the properties of the light coupling between the component and the glass fiber tip within the housing, despite the extremely critical adjustment that is necessary of the glass fiber tip relative to the most optically-active location of the component. The adjustment member of the earlier glass fiber bushing likewise permits a good adjustment of the glass fiber tip, particularly in the direction of the glass fiber axis, with reference to the optically-active location of the component. An adjustment of the glass fiber tip in the radial directions of movement (relative to the glass fiber) can likewise be achieved with the earlier glass fiber bushing, particularly with the assistance of a gripper of a micromanipulator, whereby, after the optimization of the optical coupling between component and glass fiber tip, the glass fiber can be glued to a certain block close to the diode with the assistance of an adhesive, cf. in this regard the DOS No. 32 44 882 discloses this particular aspect of the adjustment given the earlier glass fiber bushing.

Given the earlier glass fiber bushing, the adjustment member is soldered, without a fluxing agent, to the glass fiber and/or to the tube, particularly because the vapors of the fluxing agent arising during soldering can contaminate, specifically, the glass fiber tip and the optically-active location of the component and because a subsequent cleaning, i.e. removal of these contaminants, within the housing is difficult or, respectively, can produce slightly disruptive side effects.

SUMMARY OF THE INVENTION

The object of the present invention is to enable the adjustment of the glass fiber tip entirely from the exterior of the housing, so that an additional prior or subsequent fixing of the glass fiber tip then becomes generally superfluous. The present invention, in particular, improves the earlier glass fiber bushing in such a fashion that:

the adjustment of the glass fiber tip to the optically-active location of the component is externally enabled at the housing in all three coordinate directions, so that a gripper or a micromanipulator is no longer absolutely necessary within the housing for adjustment;

the final fixing enabled by way of the present invention is not only very precise, amounting, for example to ±3 μm in all three coordinate directions, but great movement of the tip of the glass fiber in all three coordinate directions, i.e. radially relative to the glass fiber as well, are possible, and permissible entirely from the exterior during adjustment for fixing, for example movements of a few tenths of a millimeter and often far more;

the reject rate or, respectively, spoilage rate during manufacture and during use of the overall arrangement is as low as possible, i.e. the arrangement should already be strong as by design;

no additional fastening of the glass fiber within the housing in the proximity of the component is necessary, for example no additional fastening with adhesive to a block as in the earlier glass fiber bushing, in order to fix the glass fiber stable over a long time, whereby changes in adjustment due to thermally-conditioned positional changes of the block and thermally-conditioned changes in property of the adhesive are completely avoidable on principle given the present invention; and the mechanical stability as well as the light tightness of the housing and of the glass fiber bushing as well as, though not a hermetic gas tightness or air tightness in every instance, but at least a certain water protection and gas protection and air protection for the components within the housing remains assurable despite the adjustability from the exterior of the housing.

The above object is achieved in an arrangement of the type generally set forth above in which a light-transmitting and/or light-receiving component to whose optically-active location of a glass fiber tip is aligned is provided in the housing. The glass fiber is firmly surrounded by a stiff tube at least in the region of passage through the housing and is secured in the tube. The tube is inserted in an opening in the housing wall defining the aforementioned passage. An adjustment member is provided for adjusting the position of the glass fiber and is inserted over the tube with a tight clearance and/or is inserted over a transitional piece which is secured to the tube. The end face of the adjustment member is oriented toward the exterior surface of the housing in the region around the wall opening. The outer diameter of the glass fiber or of a glass fiber protective layer is surrounded at least close to the tip of the glass fiber by the inner wall of the tube with so little play, for example by way of fixing with adhesive or solder metal, that the tube defines the position of the glass fiber, particularly the tip of the glass fiber and, therewith, the position of the glass fiber is secured to the exterior surface of the housing. The tube is plugged through an elastic cover of the wall opening in a region between the adjustment member and the component. A surface of the cover is secured to the housing in the environment of the wall opening and the end face of the adjustment member for adjusting the position of the tube.

Given the present invention, therefore, the stiff tube assumes the fixing of the glass fiber position, whereby the adjustment with the assistance of the adjustment member and with the assistance of the tube in all three coordinate directions is possible with utmost accuracy given high freedom of the movements of the glass fiber tip. Even the soldering of the end face of the adjustment member to the external surface of the housing as well as the soldering of the adjustment member to the tube can, in principle, also be executed with the assistance of fluxing agents, since the cover frequently already allows an adequate seal of the interior of the housing against the vapors of the fluxing agent even when the elastic cover has not yet been soldered gas-tight or glued gas-tight but is only pressed onto the wall opening in the fashion of a push button and/or when the cover is pressed against the exterior surface of the housing in the environment of the wall opening by the finally-positioned adjustment member, for example by way of an annular bead of the adjustment member. With the earlier glass fiber bushing, however, and as pointed out above, fluxing agents are to be avoided.

Additional features of the invention permit additional advantages. These features are:

- an opaque cover is secured light-tight both in the region of the edge of the wall opening of the housing, which is otherwise light-tight, and also embraces the tube which allows complete light tightness to be achieved with high reliability over a long time, whereby a certain protection against gas or, respectively, against air, as well as protection against water can be achieved at the same time;
- the cover is secured gas-tight or, respectively, air-tight to the tube and to the edge of the wall opening and the glass fiber is secured to the tube gas-tight or, respectively, air-tight which allows, for example by way of gluing, welding or soldering, not only protection against gas or, respectively, against air to be achieved, but also allows a completely hermetic gas tightness or, respectively, air tightness, as well as absolute water tightness to be achieved, even given extreme pressure fluctuations in the ambient atmosphere, therefore, for example, allows the housing to be filled with dry inert gas, for example Argon- without having the inert gas escape from the housing, even give a vacuum as the ambient atmosphere;
- the cover is preferably a metallic cover which comprises beads which allow a high elasticity of the cover and, therefore, a great freedom of movement of the tube or, respectively, of the glass fiber in all three coordinate directions to be achieved during the adjustment, even given such a metallic cover, for example of copper or bronze, in particular even when the edge of the cover is already firmly soldered to the housing and the inner hole of the cover is already firmly soldered to the tube during the adjustment;
- the glass fiber projects from the tube outside of the housing which allows the housing to be employed as an end piece of a very long fiber optical light waveguide;
- a transitional piece is inserted between the tube and the adjustment member and represents a plug, for example a socket, for a cooperating piece of the glass fiber as a plug, for example a pin, and wherein that end of the glass fiber embedded in the tube which is near the transition piece can at least nearly contact that end of the glass fiber section embedded in the cooperating piece forming a pin which is near the tube which allows the housing, together with the bushing without an attached, external fiber optic light waveguide to be stored, assembled and inspected by itself and, given a defect, permits the same to be easily and quickly exchanged for another such housing;
- the glass fiber is surrounded by the tube within the housing up to the proximity of the glass fiber tip in a fashion which still fixes the position of the glass fiber at a location close to the tip thereof which allows a very precise adjustment of the glass fiber tip and a very durable fixing in this adjustment to be achieved. This is achieved through a manufacture in which, in a first step, the tube is plugged through a corresponding hole of the cover and in a first sub-step the glass fiber is secured within the tube, for example by dip soldering. In a second step the cover is secured to the housing in a sealing fashion, for example, by way of a press fit and in a sub-step the component is rigidly secured in the housing, for example by way of point contacting a carrier of the component. In a third step the slip-on adjustment member is displaced (in the x and the y directions) at its end face along the exterior surface of the housing and the tube and/or one or more transition pieces is/are shifted in the clearance (in the z direction) until the tip of the glass fiber is optimally aligned to the optically-active location of the component. Then, the adjustment member is finely secured, for example glued, to the housing as well as to the tube and/or to the one or more transition pieces;
- the advantage of allowing a fluxing agent to be employed for the respective gas-tight or air-tight soldering of the cover and the adjustment member and, therefore, allow particularly reliable soldering could be achieved is attained by providing that in a third substep before the third step and before the second substep, for example after the second step, an adjustment of the tube in an only approximately final, optimum position of the glass fiber, for example by way of a provisionally-attached mock-up of the component, is followed by the cover being soldered gas-tight or air-tight to the housing using a fluxing agent. In a fourth substep preceding the third step and preceding the second substep, for example during the third substep and after the tube has been plugged through the cover, the cover is soldered gas-tight or air-tight to the tube by way of a fluxing agent. After the fourth step, at least the glass fiber tip is cleaned of vapor residues of the fluxing agent, as required and, only thereafter, is the second substep of the third step finally executed, whereby during the third step and after alignment of the glass fiber tip to the optically-active location of the component, the adjustment member is soldered using a fluxing agent to, on the one hand, the exterior surface of the housing at the end face of the adjustment member and, on the other hand, to the tube and/or to the transition piece or pieces, being soldering thereto at the clearance; and at least during the third step, the optimization of the alignment of the glass fiber tip to the optically-active location of the component is mensurationally checked by electrical and optical activation of the component and by feeding light into the glass fiber which allows an optimization of the adjustment of the glass fiber tip to be guaranteed.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
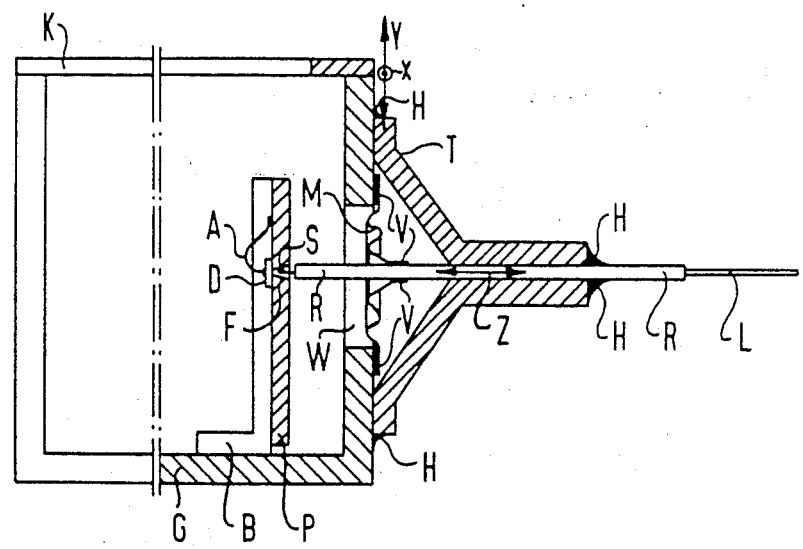
FIG. 1 is a sectional view of a housing which is durably secured to the end of a long fiber optical light waveguide.
Figure 2:
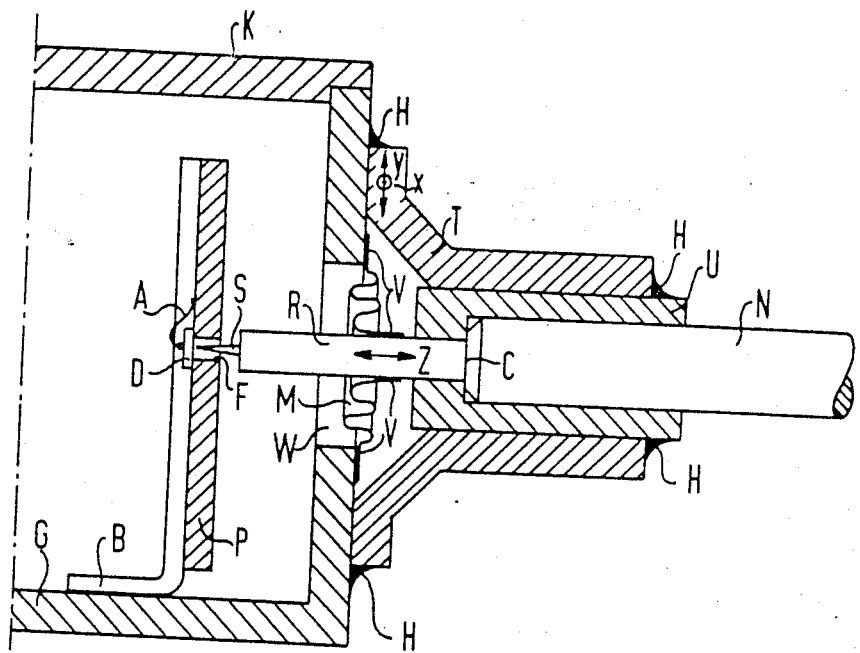
FIG. 2 illustrates another embodiment in which a plug for the connection of a fiber optical light waveguide is applied to the exterior of the housing.

Given the embodiments illustrated in FIGS. 1 and 2, they respectively comprise an air-tight metal housing G, K consisting of a cover K soldered air-tight to a can G which includes a window or wall opening W in a sidewall. The component D which transmits and/or receives light and which, therefore, can be a photodiode, a phototransistor, a solid-state laser or the like, for example, is located in the housing G/K. This component is secured to a plate P which is, in turn, secured to the cam G via a clip B which, for example, is spot-contacted (spot welded) or glued. The plate can per se carry arbitrary, further electrical components and lines, cf. the symbolically illustrated terminal A of the component D. The plate P, for example, can also be a chip. The component relative to the plate P can be applied to the same side as the glass fiber or, as on the drawings, can also be applied to the opposite side. When the plate P comprises a bore, as illustrated, then the glass fiber tip S can be passed through the bore and approach the immediate proximity of the optically-active location of the component D which is applied to the opposite side of the plate P, for example similar to that specified in the aforementioned DOS No. 32 44 882.

The glass fiber S/L in FIGS. 1 and 2 is firmly surrounded by a stiff tube R not only in the region of the bushing through the wall opening W, but right up to the proximity of the glass fiber tip and is secured air-tight in the tube R so that the glass fiber tip S can be greatly displaced and precisely adjusted in the directed of the indicated direction z by axial movement of the tube R.

The tube R is plugged through the wall opening W. A tube-like section of the adjustment member T is slipped over the tube R with a tight clearance (FIG. 1) or over a transition member U (FIG. 2) in the same manner, the adjustment member T adjusting the position of the tube R and, therefore, the position of the glass fiber S/L. In both figures, the tube-like section of the adjustment member T which guides the tube R is constructed very strong, i.e. mechanically stable. The bore of this adjustment member section, the bore directly accepting the tube R or the transition member U is also rather long, so that the adjustment member T fixes the stiff tube R and, therefore, the glass fiber S/L firmly embedded in the tube R in a stable fashion over a long time as soon as the tube R has been ultimately secured, for example, firmly soldered in the adjustment member T. The end face of the adjustment member T at the exterior surface of the housing G/K can also be additionally shifted as desired in the x direction and in the y direction in the region around the wall opening W, whereby the glass fiber tip S is also precisely adjustable in the x direction and in the y direction from the exterior of the housing without a grasping of the tube R or the glass fiber S/L from within the housing G/K with a micromanipulator being required for this purpose, as in the earlier glass fiber bushing.

After the fastening of the tube R to the tube-like section of the adjustment member T, for example by gluing or soldering, and after the fastening, for example gluing or soldering, of the adjustment member T to the housing G/K, therefore, the position of the glass fiber tip S is ultimately fixed by the stiff tube R to the optically-active location of the light-emitting or light-receiving component D, being so strongly fixed, even against shaking of the housing G/K, namely fixed in a mechanical stiff manner such that no additional holding of the tube R or, respectively, of the glass fiber S/L within the housing G/K is generally necessary.

In order to enable a precise adjustment of the glass fiber tip S, the outer diameter of the glass fiber S/L or of a glass fiber protective layer is, according to the present invention, surrounded by the inner diameter of the tube R with so little play, at least close to the glass fiber tip S, that the tube R stiffly fixes the position of the glass fiber S/L, particularly the position of the glass fiber tip S. This play can even be entirely eliminated by the application of a solder compound or an adhesive.

The glass fiber bushing constructed according to the present invention and described up to now is therefore precisely adjustable, even exclusively, from the outside, i.e. from the exterior of the housing G/K, particularly by the adjustment of the adjustment member T, given a high degree of freedom in the mobility of the tip S of the glass fiber in all three coordinate directions, even though an additional support of the tube R or of the glass fiber S/L may be attached within the housing in special instances, for example for the purpose of further improving the resistance to shaking, i.e. the insensitivity of the optical coupling between the component D and the glass fiber tip S.

According to the invention, a membrane M may be additionally applied but does not, therefore, serve the purpose of ultimate fixing, the membrane being elastic and comprising, for example, rubber or other synthetics or, for example, copper sheet or bronze sheet having beads which guarantee high elasticity and, therefore, a high freedom of mobility of the tube R, for example even high freedom of mobility in all three coordinate directions x, y and z. The tube R is thereby plugged through a hole in the elastic membrane M which is sealed to the can G about the opening W in a region between the adjustment member T and the component D. The membrane M is thereby secured, on the one hand, to the tube R, at least nearly light tight, potentially even gas-tight or air-tight and, on the other hand, is secured similarly tight in the region of the border of the wall opening W, cf. the gluing locations or, respectively, solder locations V illustrated in FIGS. 1 and 2. The light-tight fastening of the membrane M can also be achieved by pressure instead of soldering, for example, when the membrane M is correspondingly elastic and consists of, for example, a silicon rubber ring which is pressed into the wall opening W in the manner of a press button and generates the corresponding tightness in the region of the surface of the tube R by way of the internal compressive strain in the rubber without further measures.

The elastic membrane M of the wall opening W enables numerous advantages including:

A preliminary, rough adjustment of the tube R and, therefore, of the tip S of the glass fiber can be achieved by way of the only slightly stiff membrane M without the assistance of the adjustment member T. When the membrane is then immediately secured, for example by way of gluing (caution: some adhesives age and/or allow a certain diffusion of gases, solids, etc), welding (hermetic tightness requires care) or soldering (usually the most simple), then all measures within the housing can generally then already be subsequently taken care of, for example cleaning, bringing the component D into its final position, filling inert gas, etc, all of this before the glass fiber tip is finally adjusted with the assistance of the adjustment member T;

A certain gas tightness or, respectively, air tightness, even a light tightness that is usually adequate and a certain protection against water, can be achieved over a long time with the membrane M even when the adjustment member T itself is not connected to the housing G/K or to the tube R or, respectively, the glass fiber L in an adequately gas tight or air-tight manner, when, therefore, the adjustment member consists, for example, of a tube-like section, tightly embracing the tube R and having three projecting fingers, whereby the fingers, in turn, contact the exterior surface of the housing G/K and are ultimately secured thereto after the adjustment; even given a non-tight adjustment member, therefore, the membrane M at least largely prevents the formation of condensation water within the housing G/K under damp room environmental conditions;

The membrane M has a very special significance when, in order to reduce the reject rate or, respectively, the spoilage rate, fluxing agents are employed when securing the adjustment member T by way of soldering, cf. the solder locations H in FIGS. 1 and 2. When soldering, in particular, fluxing agents produce vapors which can have a very deleterious effect on the optical coupling between the component D and the tip S of the glass fiber when no membrane M is present, when, therefore, the vapors of the fluxing agent can still penetrate into the interior of the housing G/K after the final adjustment of the overall arrangement. A subsequent, residue-free cleaning of the optically-relevant portions within the housing G/K, in particular, is difficult and is frequently hardly possible at all without negatively affecting, in particular, the component D; on the other hand, it did not prove meaningful to delay final attachment of the component D within the housing until after the adjustment and after the soldering H; and In a very special fashion, the elasticity of the membrane M enables the fact that the tube R can still be displaced in the x, y and z directions during the adjustment with the assistance of the adjustment member T despite the tightness, that, i.e. the position of the glass fiber tip S can be subsequently precisely adjusted from the exterior and can be finely and durably fixed by way of corresponding fastenings, for example gluing and soldering, to the adjustment member T.

The particularly thin membranes having beads shown on the drawings have the advantage of being particularly elastic and therefore permitting particularly great variations of adjustment movements in the x, y and z directions without producing or, respectively, having to overcome high forces to that end which could bend the stiff tube R. Such a membrane M can also be durably secured in a hermetically-tight manner to the housing G and to the tube R, for example by way of soldering, even with fluxing agents, as shall be set forth below.

As the embodiment of FIG. 1 illustrates, it is accordingly also possible given the embodiment of FIG. 2 to secure an opaque membrane M in a light-tight fashion in the region of the edge of the wall opening W of the housing G/K which is otherwise a light-tight housing, and it is also possible to embrace the tube R in a light-tight fashion with the membrane M. Over and above this, it is also possible to secure the membrane M to the tube and to the edge of the wall opening W in a gas-tight manner or an air-tight manner and to secure the glass fiber S/L in the tube in a gas-tight manner or an air-tight manner so that the entire housing is made permanently gas tight or air tight, even for a vacuum environment.

FIG. 2 illustrates an embodiment in which the tube R is first fixed by a transitional piece U which is, in turn, fixed by the adjustment member T. The transitional piece U can exercise further functions, for example, in particular the function of a plug into which a plug pin N of a long fiber optic cable is introduced as a cooperating member. At a location C, the end of the glass fiber section embedded in the pin N and the end of the glass fiber section embedded in the tube R contact, at least nearly contact. Of course, different plug types and those illustrated in FIG. 2 are also possible. Due to the application of a transitional piece U designed as a plug, it therefore becomes possible to store, mount and inspect the overall arrangement comprising housing, component, socket in and of itself after adjustment and final fixing; a simple replacement of this overall arrangement for another identical overall arrangement is then possible in case of defects.

Given the example illustrated in FIG. 1, however, the glass fiber L projects freely from the tube R outside of the housing G/K. In this case, therefore, the overall arrangement comprising housing, component, tube and adjustment member is a constantly-connected terminal arrangement at a glass fiber having an arbitrary length. During testing with this embodiment, the extraordinary solidity, particularly mechanical stability, of this overall arrangement constructed in accordance with the present invention becomes apparent; tensile stresses of even 5 kiloponds between the housing G/K and the end of the tube R projecting out of the adjustment member had no noticeable influence on the optical qualities of the coupling between the tip S of the glass fiber and the component D. Due to the use of a bushing constructed in accordance with the present invention, therefore, the overall arrangement is, in fact, stable in terms of design.

The glass fiber bushing, according to the present invention, can be manufactured, for example in four steps and two substeps in addition thereto are observed as manufacturing steps in a specified manner, cf. in the examples in FIGS. 1 and 2 in the following regard.

In a first step, the tube R is plugged through a corresponding hole in the membrane M.

In a first substep, in particular before the second major step or even before the first step, the glass fiber S/L is secured within the tube R, for example by dip soldering or gluing, being at least so solidly secured therein that the tube position unequivocally fixes the position of the glass fiber tip without the tip wobbling.

In a second step, performed after the first step, the membrane M is secured in an adequately-tight fashion to the housing G/K, for example by a press fit, by soldering or gluing, depending on the selection of materials and the tightness requirements. This securing preferably occurs such that the glass fiber S/L is already approximately oriented toward the final position of the component D, which can also be initially facilitated with the assistance of only a mock-up of the component D and of its carrier P/B.

In a second substep, performed before the below-discussed third step, for example even below the first substep and before the first step, the component D is rigidly fixed in its final position in the housing G/K, for example by point contacting of the carrier P/B of the component D to the can G.

In a third step, performed after the second step, the adjustment member T is slipped onto the tube R or, respectively, onto the transitional piece U, with a tight clearance and is displaced at its end face along the exterior surface of the housing G/K in the illustrated x and y directions and the tube R and/or one or more transitional pieces U are displaced in the z direction in the gap until the tip S of the glass fiber is optimally aligned to the optically-active location of the component D. At least during this third step, the optimization of the alignment of the glass fiber tip to the optically-active location of the component D can also be mensurationally checked by electrical and optical activation of the component D and by feeding light into the glass fiber S/L, in particular by feeding light externally through the glass fiber S/L to the component D given a light-receiving component D upon supervision of the component current; and by feeding the emitted optical light given a light-transmitting component D into the glass fiber tip S upon supervision of the light current externally received at the glass fiber L, for example by a photodiode connected thereto.

In a fourth step, performed after the third step, the adjustment member T is secured to the housing G as well as to the tube R, and/or to the one or more transition pieces U, being, for example, glued to soldered thereto in that welding, in this case, would frequently provide too great of a disturbance to the achieved adjustment after the fact.

The solidity of the glass fiber bushing, i.e. particularly the avoidance of rejects in the manufacture thereof and of rejects during later employment of the overall arrangement can be further improved.

To this end, as already explained in part above, the membrane M can not only be soldered in a gas-tight manner or an air-tight manner to the housing G/K at the locations V using fluxing agents, and being soldered thereto in a third sub-step performed by the third step and before the second sub-step, for example after the second step and after an adjustment of the tube R in only an approximately final, optimum position of the glass fiber S/L, for example by using a provisionally attached marked-up of the component, but the membrane M can also be soldered in a gas-tight manner or an air-tight manner to the tube R with fluxing agents in a further substep before the third step and before the second substep, for example during the further substep after the tube R has been plugged through the membrane M. Subsequently thereto, namely after the third step and after the fourth substep, at least the tip S of the glass fiber can be cleaned of vapor residues of the fluxing agent as required.

In this case, the second substep and the third step are only finally executed thereto, whereby the adjustment member T is again soldered in a particularly stable fashion by using a fluxing agent during the third step, after alignment of the tip S of the glass fiber to the optically-active location of the component D, being soldered, on the one hand, at its end face to the exterior surface of the housing G/K and, on the other hand, at the gap to the tube R, and/or to the transition piece or pieces U, cf. the locations H in FIGS. 1 and 2.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A glass fiber bushing structure, comprising:
   a glass fiber including a tip;
   a housing including a side wall having a first opening therethrough;
   a component mounted in said housing and including an optically-active location facing said opening;
   a flexible diaphragm secured to said side wall and covering said first opening, said diaphragm including a second opening therethrough;
   a stiff tube surrounding and secured to said glass fiber and including a first end and a second end, said tube extending through said second opening in a tightly-sealed relationship to said diaphragm and positioning said tip adjacent said optically-active location, said tube having its second end external of said housing and, until later fixed, adjustable being to position said tip; and
   an adjustment member including a bore closely receiving said tube therethrough, said tube being fixed in said bore in a first coordinate direction, said adjustment member initially movable in second and third coordinate directions to further adjust said tip and then secured to said housing and to said tube.

2. The glass fiber bushing structure of claim 1, wherein:
said diaphragm comprises opaque material to provide a light seal of said first opening.

3. The glass fiber bushing structure of claim 1, wherein:
said diaphragm is sealed gas-tight to said housing side wall and to said tube.

4. The glass fiber bushing structure of claim 1, wherein:
said diaphragm comprises metal and beads sealing said diaphragm to said side wall.

5. The glass fiber bushing structure of claim 1, wherein:
said glass fiber includes an end opposite said tip, said end extending beyond said second end of said tube.

6. The glass fiber bushing structure of claim 1, wherein:
said first end of said tube is adjacent said tip.

7. A glass fiber bushing structure, comprising:
a glass fiber including a proximal tip and a distal end;
a housing including a side wall having a first opening therethrough;
a component mounted in said housing and including an optically-active location facing said opening;
a flexible diaphragm secured to said side wall and covering said first opening, said diaphragm including a second opening therethrough;
a stiff tube surrounding and secured to said glass fiber and including a first end adjacent said tip and a second end at said distal end of said fiber, said tube extending through said second opening in a tightly-sealed relationship to said diaphragm and positioning said tip adjacent said optically-active location, said tube being with its second end external of said housing, adjustable to position said tip;
a transition member including a bore receiving said second end of said tube with said distal end of said fiber located at a face serving as an optical socket plug junction; and
an adjustment member including a bore receiving said transition member therethrough for fixing said transition member in said adjustment member bore in a first coordinate direction, said adjustment member being initially movable in second and third coordinate directions to further adjust said proximal tip and then secured to said housing and to said transition member.

8. A method of manufacturing a glass fiber bushing structure from a plurality of elements including a housing having an opening through a side wall, an optical component including an optically-active location, a glass fiber including a tip and an opposite end, a stiff tube, a flexible diaphragm including an opening therethrough, and an adjustment member including a section having a bore of approximately the same diameter as the tube and a flange, comprising the steps of:
(a) threading the optical fiber through the stiff tube with the tip extending out of and adjacent one end of the tube;
(b) securing the glass fiber to the tube;
(c) mounting the component in the housing with its optically active location facing the opening;
(d) passing the tube through the opening in the diaphragm;
(e) sealing the diaphragm about the opening in the side wall;
(f) threading the stiff tube through the bore of the adjustment member and (f1) adjusting the tip position in the x and y coordinate directions by moving the adjustment member externally of the housing and (f2) adjusting the tip in the z coordinate direction by moving the stiff tube externally of the housing; and
(g) securing the flange of the adjustment member to the housing and the bore section to the tube.

9. The method of claim 8, wherein the step (b) of securing the glass fiber to the tube is further defined as:
(b1) dip soldering the glass fiber to the tube.

10. The method of claim 8, wherein the step (e) of sealing is further defined as:
(e1) pressing the diaphragm into the opening through the side wall.

11. The method of claim 8, wherein the step (e) of sealing is further defined as:
(e1) bending the peripheral edge of the diaphragm about the opening in the side wall.

12. The method of claim 8, wherein the step (g) of securing is further defined as:
(g1) gluing the adjustment member flange to the housing and its bore section to the tube.

13. The method of claim 8, wherein the optical component is a light-emitting component, and further comprising the steps of:
during the step (f),
(h) electrically driving the optical component to transmit light over the glass fiber; and
(i) sensing the light transmitted over the glass fiber while adjusting the adjustment member and the tube for the optimal position of the tip of the glass fiber.

14. The method of claim 8, wherein the optical component is a light receiving component, and further comprising the steps of:
during the step (f),
(h) applying light signals to the glass fiber to operate the component to produce current; and
(i) sensing the current produced by the component.

15. The method of claim 8, and further comprising the steps of:
(j) at least prior to the step (f), adjusting the tip in the z direction to an approximate final position.

16. The method of claim 15, and further comprising the steps of:
(k) after the step (j) and prior to the step (e), soldering the tube to the membrane using a fluxing agent; and
(l) cleaning the tip of vapor residues arising from the fluxing agent.

17. The method of claim 16, wherein the step (g) is further defined by the steps of:
(g1) soldering the flange of the adjustment member to the outer surface of the side wall; and
(g2) soldering the bore section of the adjustment member to the stiff tube.

18. A method of manufacturing a glass fiber bushing structure from a plurality of elements including a housing having an opening through a side wall, an optical component including an optically-active location, a glass fiber including a tip and an opposite end, a stiff tube, a transition member including first and second coaxial bores, a flexible diaphragm including an opening therethrough, and an adjustment member including a section having a bore of approximately the same diameter as the transition member and a flange, comprising the steps of:
- (a) threading the optical fiber through the stiff tube with the tip extending out of and adjacent one end of the tube;
- (b) securing the glass fiber to the tube;
- (c) mounting the component in the housing with its optically-active location facing the opening;
- (d) passing the tube through the opening in the diaphragm;
- (e) sealing the diaphragm about the opening in the side wall;
- (f) threading the stiff tube through the first bore of the transition member and inserting the transmission member through the bore of the adjustment member and (f1) adjusting the tip position in the x and y coordinate directions by moving the adjustment member externally of the housing and (f2) adjusting the tip in the z coordinate direction by moving the transition member externally of the housing; and
- (g) securing the flange of the adjustment member to the housing and the bore section to the transition member.

19. The method of claim 18, wherein the step (b) of securing the glass fiber to the tube is further defined as:
- (b1) dip soldering the glass fiber to the tube.

20. The method of claim 18, wherein the step (e) of sealing is further defined as:
- (e1) pressing the diaphragm into the opening through the sidewall.

21. The method of claim 18, wherein the step (e) of sealing is further defined as:
- (e1) bending the peripheral edge of the diaphragm about the opening in the side wall.

22. The method of claim 18, wherein the step (g) of securing is further defined as:
- (g1) gluing the adjustment member flange to the housing and its bore section to the transition member.

23. The method of claim 18, wherein the optical component is a light-emitting component, and further comprising the steps of:
during the step (f),
- (h) electrically driving the optical component to transmit light over the glass fiber; and
- (i) sensing the light transmitted over the glass fiber while adjusting the adjustment member and the transition member for the optimal position of the tip of the glass fiber.

24. The method of claim 18, wherein the optical component is a light receiving component, and further comprising the steps of:
during the step (f),
- (h) applying light signals to the glass fiber to operate the component to produce current; and
- (i) sensing the current produced by the component.

25. The method of claim 18, and further comprising the steps of:
- (j) at least prior to the step (f), adjusting the tip in the z direction to an approximate final position.

26. The method of claim 25, and further comprising the steps of:
- (k) after the step (j) and prior to the step (e), soldering the tube to the membrane using a fluxing agent; and
- (l) cleaning the tip of vapor residues arising from the fluxing agent.

27. The method of claim 26, wherein the step (g) is further defined by the steps of:
- (g1) soldering the flange of the adjustment member to the outer surface of the side wall; and
- (g2) soldering the bore section of the adjustment member to the transition member.

* * * * *